(12) United States Patent
Kobayashi

(10) Patent No.: US 9,711,547 B2
(45) Date of Patent: Jul. 18, 2017

(54) IMAGE PICKUP APPARATUS

(71) Applicant: CANON KABUSHIKI KAISHA, Tokyo (JP)

(72) Inventor: Masahiro Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/924,457

(22) Filed: Oct. 27, 2015

(65) Prior Publication Data

US 2016/0126274 A1    May 5, 2016

(30) Foreign Application Priority Data

Oct. 31, 2014    (JP) .................. 2014-223354

(51) Int. Cl.
*H01L 31/062* (2012.01)
*H01L 27/146* (2006.01)

(52) U.S. Cl.
CPC .. *H01L 27/14612* (2013.01); *H01L 27/14643* (2013.01)

(58) Field of Classification Search
CPC ............... H01L 27/14612; H01L 27/14643
USPC ........ 257/291, 443, 233, 228, 239; 348/308; 250/208.1, 370.11
See application file for complete search history.

(56) References Cited

U.S. PATENT DOCUMENTS

| 8,836,836 B2* | 9/2014 | Yamazaki | H04N 5/32 348/241 |
| 2002/0190215 A1* | 12/2002 | Tashiro | H01L 27/14658 250/370.11 |
| 2008/0237446 A1* | 10/2008 | Oshikubo | H01L 27/14603 250/208.1 |
| 2011/0248371 A1* | 10/2011 | Matsumura | H01L 27/14612 257/443 |
| 2016/0044264 A1* | 2/2016 | Sakano | H01L 27/14609 348/308 |

FOREIGN PATENT DOCUMENTS

JP    2008-205639 A    9/2008

* cited by examiner

*Primary Examiner* — Mohammed Shamsuzzaman
(74) *Attorney, Agent, or Firm* — Canon U.S.A., Inc., IP Division

(57) ABSTRACT

To provide an image pickup apparatus that can increase capacitance value of an input node in a connection state without decreasing amplification transistor gain when capacitance is in a non-connection state. In an image pickup apparatus according to an aspect of the present disclosure, a gate electrode of an amplification transistor is arranged on a main surface of the semiconductor substrate, a third semiconductor region having a second conductivity type is arranged in a lower part of the gate electrode, and an added impurity concentration of impurity having the second conductivity type on a PN junction surface of a capacitance is higher than a highest value of an added impurity concentration having the second conductivity type in a region from the main surface up to a depth at which a source and a drain of the amplification transistor are arranged in the third semiconductor region.

30 Claims, 7 Drawing Sheets

313A  300  313B
FIRST DIRECTION 201  302  115  300  313B  112
FIRST DIRECTION

IMAGE PICKUP APPARATUS

BACKGROUND OF THE INVENTION

Field of the Invention

The present disclosure relates to an image pickup apparatus. The disclosure specifically relates to a configuration of a capacitance with which a capacitance value of an input node of an amplification transistor can be changed.

Description of the Related Art

Up to now, a configuration has been proposed in which a capacitance is connected to an input node of an amplification transistor to expand a dynamic range of a signal output from a pixel.

Japanese Patent Laid-Open No. 2008-205639 discloses a configuration in which a PN junction is used as the capacitance to be connected to the input node of the amplification transistor.

SUMMARY OF THE INVENTION

An image pickup apparatus according to an aspect of the present disclosure includes: a photoelectric conversion unit; an amplification transistor configured to amplify a signal based on charges generated by the photoelectric conversion unit; a capacitance that has a PN junction constituted by a first semiconductor region having a first conductivity type and a second semiconductor region having a second conductivity type and can accumulate the charges; and a plurality of pixels that can change a capacitance value of an input node of the amplification transistor by switching a connection state of the capacitance, in which a gate electrode of the amplification transistor is arranged on a main surface of a semiconductor substrate, and a third semiconductor region having the second conductivity type is arranged in a lower part of the gate electrode of the amplification transistor, and an added impurity concentration of impurity having the second conductivity type on a PN junction surface of the capacitance is higher than a highest value of an added impurity concentration having the second conductivity type in a region from the main surface up to a depth at which a source and a drain of the amplification transistor are arranged in the third semiconductor region.

Further features of the present disclosure will become apparent from the following description of exemplary embodiments with reference to the attached drawings.

DESCRIPTION OF THE EMBODIMENTS

First Exemplary Embodiment

An image pickup apparatus according to an exemplary embodiment of the present disclosure will be described in FIG. 1 to FIGS. 6A and 6B. Parts assigned with the same reference symbol in each of the drawings correspond to the same element or the same region.

Figure 1:
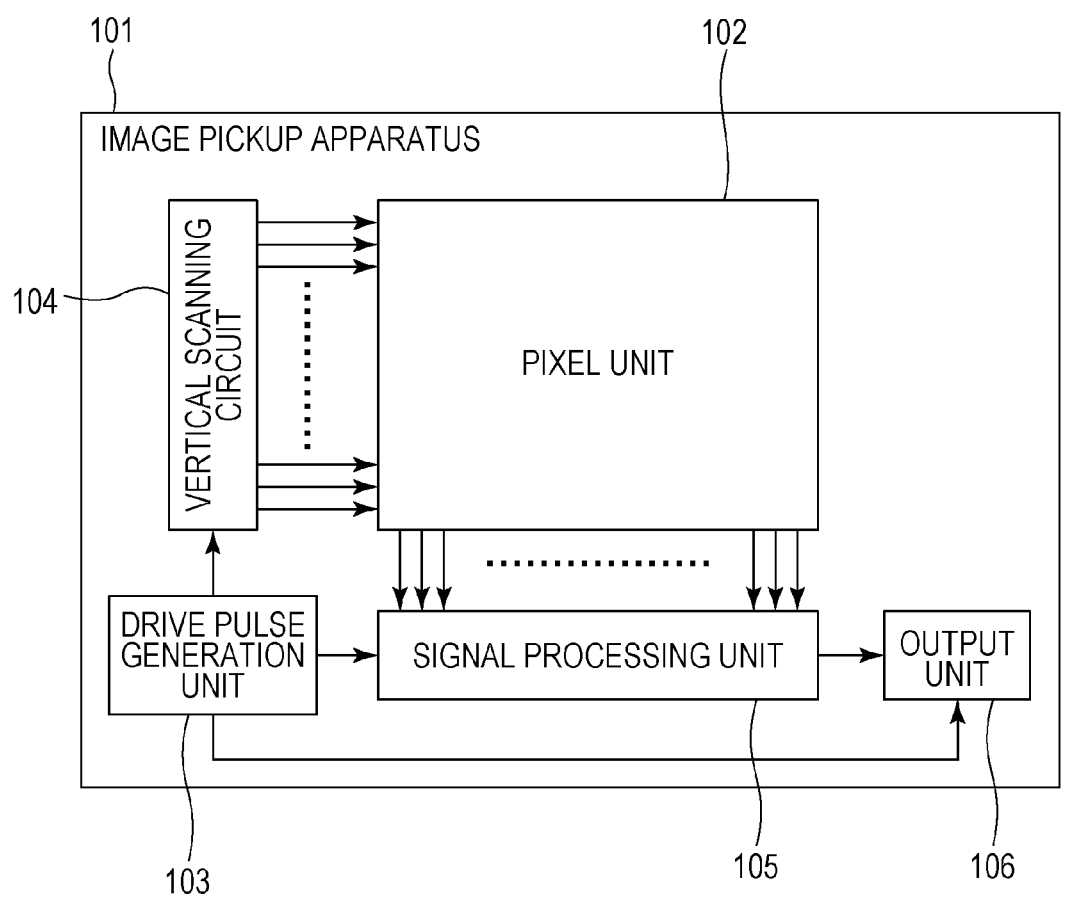
FIG. 1 is a block diagram of an image pickup apparatus according to an aspect of the present disclosure.

FIG. 1 is a block diagram of an image pickup apparatus according to an exemplary embodiment of the present disclosure. An image pickup apparatus 101 includes a pixel unit 102, a drive pulse generation unit 103, a vertical scanning circuit 104, a signal processing unit 105, and an output unit 106.

The pixel unit 102 includes a plurality of pixels that are arranged in matrix and configured to convert light into an electric signal and output the converted electric signal. The drive pulse generation unit 103 generates a drive pulse. The vertical scanning circuit 104 receives the drive pulse from the drive pulse generation unit 103 and supplies control pulses to the respective pixels. The signal processing unit 105 serializes at least signals output in parallel from a plurality of pixel columns to be transmitted to the output unit 106. Furthermore, the signal processing unit 105 may include column circuits that correspond to the respective pixel columns and perform signal amplification, analog-to-digital (AD) conversion, and the like.

Figure 2:
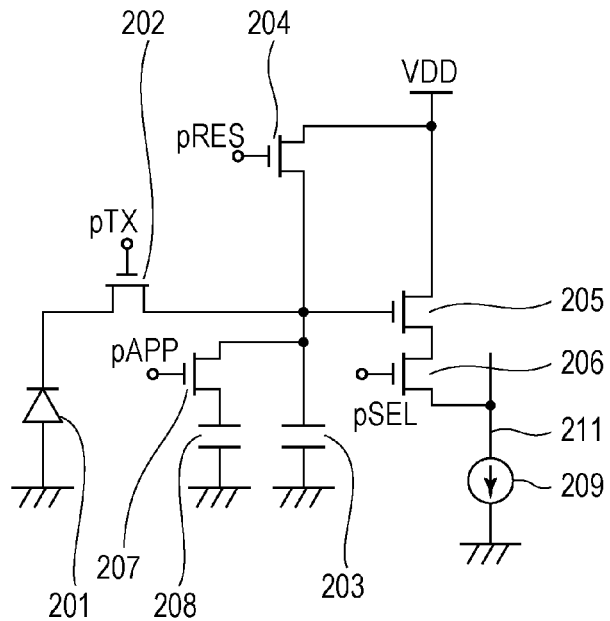
FIG. 2 is a circuit diagram of a pixel according to an aspect of the present disclosure.

FIG. 2 illustrates an exemplary equivalent circuit of one pixel arranged in the pixel unit 102 according to the present exemplary embodiment. Descriptions will be given while electrons are set as signal charges according to the present exemplary embodiment, and respective transistors are constituted by N-type transistors. A capacitance 208 holds the electrons. It is however noted that these configurations may be modified in a manner that holes may be set as the signal charges by inverting the conductivity types of respective semiconductor regions constituting a photoelectric conversion unit 201 and the capacitance 208.

The equivalent circuit is not limited to FIG. 2, and a part of configurations may be shared by a plurality of pixels. The present exemplary embodiment can be applied to any of a front surface irradiation type image pickup apparatus in which light is incident from a front surface side and a rear surface irradiation type image pickup apparatus in which light is incident from a rear surface side. The same applies to the following respective exemplary embodiments.

The pixel according to the present exemplary embodiment includes the capacitance 208 with which a capacitance value of an input node of an amplification transistor 205 can be changed. The input node of the amplification transistor 205 is constituted by including an FD 203, a source of a reset transistor 204, a gate electrode of the amplification transistor 205, and conductive materials that electrically connect these members to one another. The capacitance 208 described above is provided such that connection and non-connection states can be switched with respect to any one of these members. The capacitance 208 constitutes a part of the input node of the amplification transistor 205 in the connection state. Hereinafter, the pixel of the present exemplary embodiment will be described in detail by using FIG. 2.

The photoelectric conversion unit 201 generates the amount of charge pairs corresponding to the incident light amount by photoelectric conversion to accumulate electrons. A photodiode is used as the photoelectric conversion unit 201. A transfer transistor 202 transfers the electrons accumulated in the photoelectric conversion unit 201 to the FD 203. A gate electrode of the transfer transistor 202 is supplied with a control pulse pTX, and an ON state and an OFF state are switched. The FD 203 can accumulate the electrons transferred by the transfer transistor 202.

The gate electrode of the amplification transistor 205 is connected to the FD 203, and the amplification transistor 205 amplifies a signal based on the electrons transferred to the FD 203 by the transfer transistor 202 and outputs the signal. More specifically, the electrons transferred to the FD 203 are converted into a voltage in accordance with the amount of the electrons, and an electric signal in accordance with the voltage is output to an external part of the pixel via the amplification transistor 205. The amplification transistor 205 constitutes a source-follower circuit together with a current source 209. A drain of the amplification transistor 205 is supplied with a power source voltage VDD.

The reset transistor 204 resets a potential of the input node of the amplification transistor 205. The potential of the photoelectric conversion unit 201 can be reset by overlapping the ON periods of the reset transistor 204 and the transfer transistor 202 with each other.

A gate electrode of the reset transistor 204 is supplied with a control pulse pRES, and an ON state and an OFF state are switched. A drain of the reset transistor 204 is supplied with the power source voltage VDD. Herein, the drain of the reset transistor 204 and the drain of the amplification transistor 205 are supplied with the same power source voltage VDD but may be supplied with different voltages.

A selection transistor 206 outputs signals of the plurality of pixels provided to one signal line 211 from one pixel at a time or plural pixels at a time. A drain of the selection transistor 206 is connected to a source of the amplification transistor 205, and a source of the selection transistor 206 is connected to the signal line 211.

As an alternative to the configuration according to the present exemplary embodiment, the selection transistor 206 may be provided between the drain of the amplification transistor 205 and a power source line where the power source voltage VDD is supplied. In either case, the selection transistor 206 controls an electrical connection between the amplification transistor 205 and the signal line 211. A gate electrode of the selection transistor 206 is supplied with a control pulse pSEL, and an ON state and an OFF state of the selection transistor 206 are switched.

It is noted that the source of the amplification transistor 205 may be connected to the signal line 211 without the provision of the selection transistor 206. In addition, a selection state and a non-selection state may be switched by switching a potential of the drain of the amplification transistor 205 or the gate electrode of the amplification transistor 205.

The capacitance 208 constitutes a part of the input node of the amplification transistor 205 in the connection state and is separated from the input node in the non-connection state. Accordingly, the capacitance value of the input node of the amplification transistor 205 can be changed. In the present example, the switching of the connection state and the non-connection state of the capacitance 208 is controlled by a switching transistor 207.

The capacitance 208 and the switching transistor 207 commonly use a part of configurations. For example, the capacitance 208 can be constituted by a gate insulating film capacitance (MOS capacitance) of the switching transistor 207, a PN junction capacitor constituted by an N-type semiconductor region that constitutes the source, and a parasitic capacitance. It is however noted that each of the capacitance 208 and the switching transistor 207 may be constituted by independent components without the shared use.

The switching transistor 207 is supplied with a control pulse pAPP, and an ON state and an OFF state are switched.

In a case where the capacitance 208 is put into the connection state to increase the capacitance value of the input node of the amplification transistor 205, it is possible to decrease a charge-voltage conversion efficiency in the input node of the amplification transistor 205 as compared with a case where the capacitance 208 is put into the non-connection state.

Therefore, when the capacitance value is high, it is possible to maintain linearity of the output signal from the amplification transistor 205 even if a large amount of charges are generated in the photoelectric conversion unit. That is, it is possible to expand the dynamic range.

In contrast to this, in a case where the capacitance 208 is put into the non-connection state to decrease the capacitance value of the input node of the amplification transistor 205, the charge-voltage conversion efficiency in the input node of the amplification transistor 205 is improved as compared with a case where the capacitance 208 is put into the connection state.

This is because, when the capacitance value is low, the charge-voltage conversion efficiency for converting the charges into the voltage in the input node is increased, and as a result, a gain of the amplification transistor 205 can be increased.

The change in the dynamic range can be realized by switching these configurations to be used.

Figure 3:
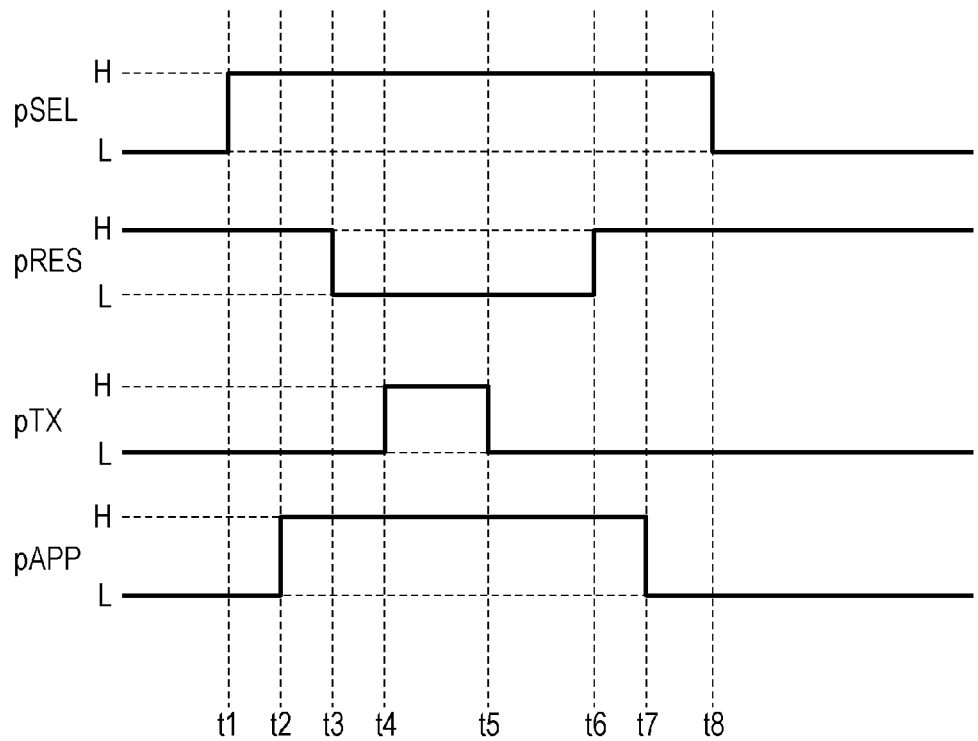
FIG. 3 is a drive timing chart according to an aspect of the present disclosure.

Next, FIG. 3 illustrates example drive pulses of the pixel circuit illustrated in FIG. 2. Herein, only the drive pulses directly related to a characteristic of the present exemplary embodiment will be described.

The respective transistors are in the ON state in a period during which the respective control pulses are at a high level.

First, at a time T=t1, the control pulse pSEL turns to a high level. In addition, at this time, the control pulse pRES is at the high level, the potential of the FD 203 is reset.

Next, at a time T=t2, while the control pulse pSEL and the control pulse pRES maintains the high level state, the control pulse pAPP turns to the high level. Accordingly, the capacitance 208 is connected to the FD 203, and the potentials of the FD 203 and the capacitance 208 are reset.

Next, at a time T=t3, the control pulse pRES turns to a low level, and the reset of the potentials of the FD 203 and the capacitance 208 is completed.

At a time T=t4, the control pulse pTX turns to the high level. At this time, the photoelectric conversion unit 201 and the FD 203 are put into a conductive state, and the electrons of the photoelectric conversion unit 201 are transferred to the FD 203. Since the control pulse pAPP is at the high level, and the capacitance 208 is in the connection state, the transferred electrons are held in the FD 203 and the capacitance 208.

At a time T=t5, the control pulse pTX turns to the low level. Accordingly, the photoelectric conversion unit 201 and the FD 203 are interrupted.

At a time T=t6, since the control pulse pRES turns to the high level, the potentials of the FD 203 and the capacitance 208 are reset.

At a time T=t7, the control pulse pAPP turns to the low level. Accordingly, the capacitance 208 is put into the non-connection state.

At a time T=t8, the control pulse pSEL turns to the low level.

In a period T5 to T8, while the voltage of the signal line 211 is used as the signal, it is possible to use the signal of the pixel in a state of being connected to the capacitance 208 as an image signal.

Furthermore, when necessary, in a period T3 to T4, while the voltage of the signal line 211 is used as the signal, it is possible to obtain a noise signal of the pixel. While a difference between this noise signal and the above-described image signal is taken, it is possible to reduce noise. It is noted that the control pulse pSEL is regularly kept at the high level in a period T1 to T8, but the control pulse pSEL may be set at the high level only in a period during which the signals held in the input node of the amplification transistor 205 and the capacitance 208 are read out to the signal processing unit 105 illustrated in FIG. 1.

FIG. 3 illustrates the drive pulse with which the capacitance 208 is put into the connection state. It is however noted that, while the control pulse pAPP is set at the low level in a period T2 to T7, the capacitance 208 is put into the non-connection state.

By switching the connection state and the non-connection state of the capacitance 208 in the above-described manner, it is possible to change the capacitance value of the input node of the amplification transistor 205. The switching of the connection state and the non-connection state of the capacitance 208 may be performed for all the pixels at once or may be performed for each pixel.

Next, characteristics of the capacitance 208 will be described, according to the present exemplary embodiment. The capacitance 208 according to the present exemplary embodiment includes the PN junction capacitor. The N-type semiconductor region of the capacitance 208 is a semiconductor region having a same conductivity type (first conductivity type) as the charges held in the PN junction capacitor, and a P-type semiconductor region of the capacitance 208 is a semiconductor region having an opposite conductivity type (second conductivity type) to the charges held in the capacitance 208. The amplification transistor 205 is an N-type transistor in which a gate electrode is arranged on a main surface of a semiconductor substrate, and a P-type semiconductor region is arranged in a lower part of the gate electrode.

A P-type added impurity concentration of the PN junction surface of the capacitance 208 is higher than a highest value of a P-type added impurity concentration of the P-type semiconductor region in a region from the main surface of the semiconductor substrate up to a depth at which the source region and the drain region of the amplification transistor 205 are arranged in the P-type semiconductor region arranged in the lower part of the gate electrode of the amplification transistor 205.

Herein, the depth at which the source region and the drain region are arranged is a depth at which the source region and the drain region constitute the PN junction with semiconductor regions having the opposite conductivity type to that of these regions.

In a case where "added impurity concentration" is described in the present specification, the concentration means a concentration of actually added impurity. Measurement for the above-described added impurity concentration can be performed, for example, by SIMS method and SCM method. According to these methods, it is possible to verify how much the impurity exists per unit volume.

In contrast to this, in a case where simply "impurity concentration" is described in the present specification, the concentration means a net impurity concentration in which the added impurity concentration is compensated by impurity having the opposite conductivity type. For example, when an N-type added impurity concentration is higher than the P-type added impurity concentration in a predetermined region, the region corresponds to the N-type semiconductor region. On the other hand, when the P-type added impurity concentration is higher than the N-type added impurity concentration in a predetermined region, the region corresponds to the P-type semiconductor region. Then, a region where the N-type added impurity concentration is equal to the P-type added impurity concentration constitutes a PN junction surface.

FIGS. 4A and 4B and FIGS. 5A and 5B are respectively schematic plan views and schematic cross-sectional views of one pixel for describing the characteristics of the image pickup apparatus according to one or more aspects of the exemplary embodiments.

Figure 4A:
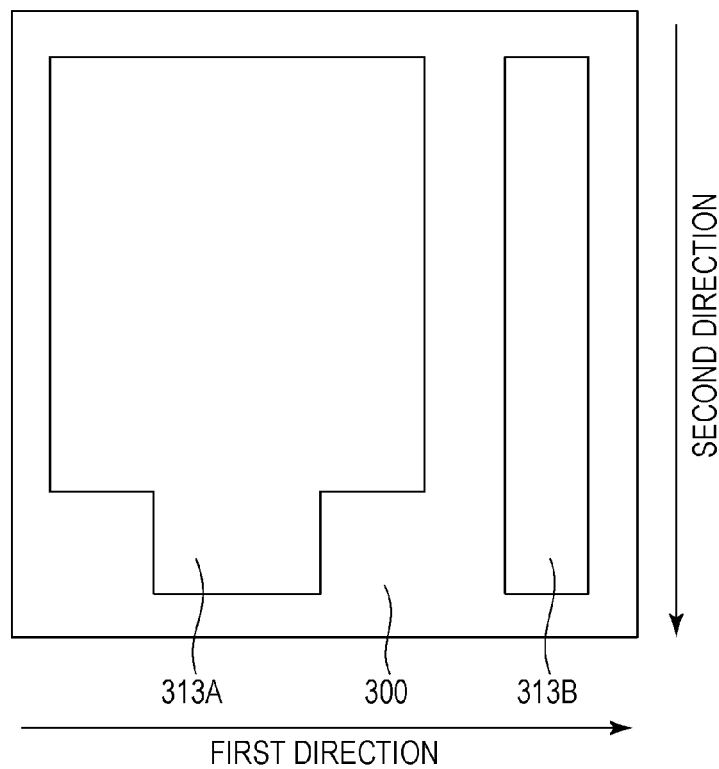
FIGS. 4A and 4B are schematic plan views of the pixel according to one or more aspects of the present disclosure.
Figure 4B:
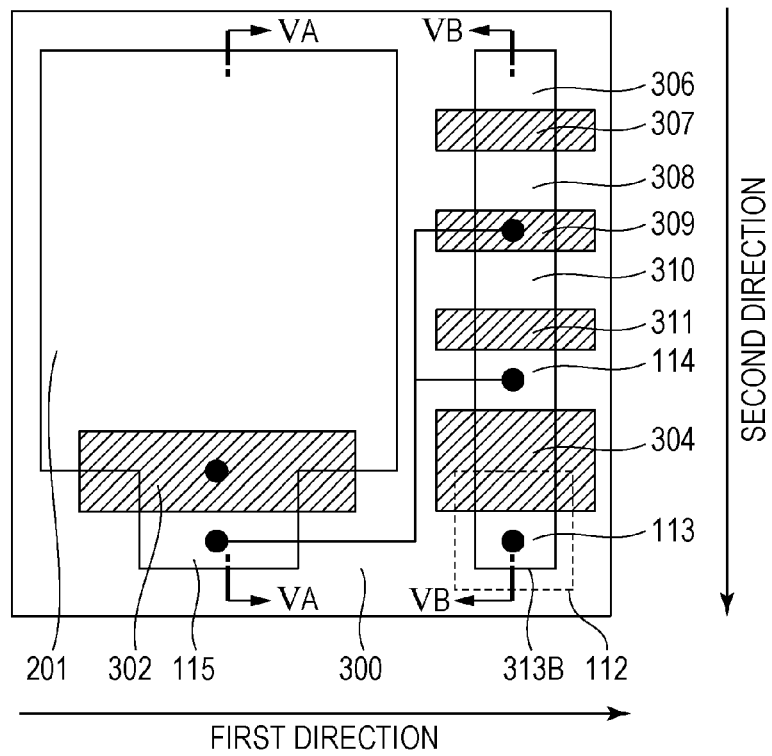

FIG. 4A illustrates an insulator isolation portion 300 and a first active region 313A and a second active region 313B which are comparted by the insulator isolation portion 300 to simplify descriptions of the active regions. As illustrated in FIG. 4B, within the single pixel, semiconductor regions are arranged in the first active region 313A and the second active region 313B, and also, gate electrodes are arranged on the first active region 313A and the second active region 313B in a manner that the gate electrodes are overlapped with parts of the first active region 313A and the second active region 313B. It is noted that the reference symbols 313A and 313B corresponding to the active regions assigned in FIG. 4A are omitted in FIG. 4B.

The first active region 313A and the second active region 313B are arranged side by side along a first direction. As illustrated in FIG. 4B, the photoelectric conversion unit 201, a gate electrode 302 of the transfer transistor 202, and an N-type sixth semiconductor region 115 are arranged in the first active region 313A along a second direction.

An N-type ninth semiconductor region 306, a gate electrode 307 of the selection transistor 206, and an N-type eleventh semiconductor region 308 are arranged in the second active region 313B along the second direction. Furthermore, a gate electrode 309 of the amplification transistor 205, the N-type semiconductor region 310, a gate electrode 311 of the reset transistor 204, an N-type fifth semiconductor region 114, a gate electrode 304 of the switching transistor 207, and an N-type first semiconductor region 113 are arranged in the second active region 313B.

These gate electrodes are arranged on a surface of the semiconductor substrate via the gate insulating film, and herein, this surface is referred to as a main surface. It is noted that, with regard to the first active region 313A and the second active region 313B, these active regions are constituted as separate active regions while the isolation regions are provided between the first and second active regions but may be constituted as the same active region.

Figure 5A:
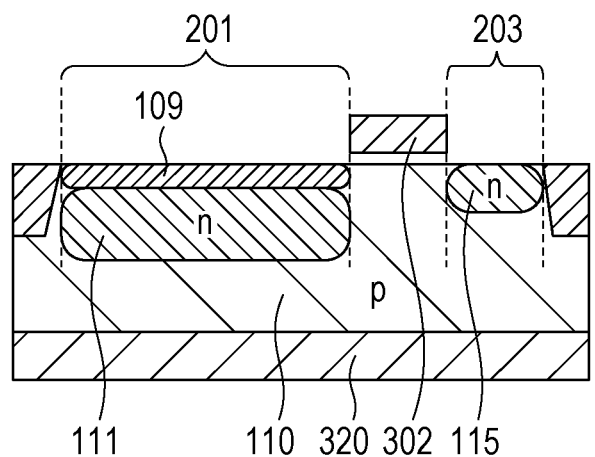
FIGS. 5A and 5B are schematic cross-sectional views of the pixel according to one or more aspects of the present disclosure.
Figure 5B:
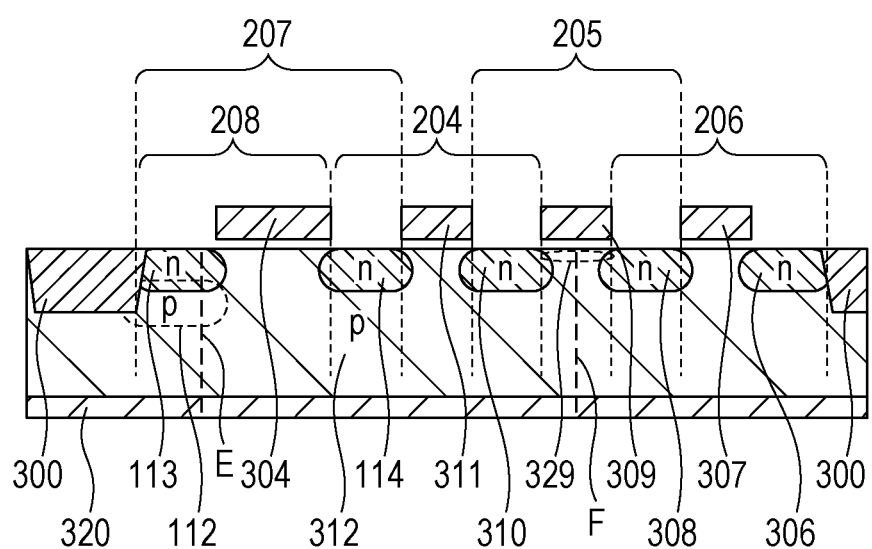

FIG. 5A is a schematic cross-sectional view along the VA-VA line in FIG. 4B, and FIG. 5B is a schematic cross-sectional view along the VB-VB line in FIG. 4B.

In FIG. 5A, the photoelectric conversion unit 201 has a PN junction constituted by the P-type semiconductor region 110 and the N-type semiconductor region 111. Furthermore, the P-type semiconductor region 109 is arranged on the main side of the N-type semiconductor region 111. The photoelectric conversion unit 201 constitutes a buried-type photodiode by these semiconductor regions.

The FD 203 is constituted by the N-type sixth semiconductor region 115. The FD 203 constitutes the PN junction with the P-type semiconductor region 110 arranged in the vicinity of the FD 203, and electrons transferred from the photoelectric conversion unit 201 are held by a capacitance constituted by this PN junction.

It is noted that the P-type semiconductor region 110 is preferably set as a P-type semiconductor region having a lower impurity concentration than that of a second semiconductor region 112 that will be described below. This is because it is possible to decrease the PN junction capacitor of the FD 203 when the N-type sixth semiconductor region 115 constitutes the PN junction with the P-type semiconductor region having the lower impurity concentration than that of the second semiconductor region 112 as compared with a case where the N-type sixth semiconductor region 115 constitutes the PN junction with the second semiconductor region 112. Accordingly, it is possible to improve the gain of the amplification transistor 205 since the capacitance value of the input node of the amplification transistor 205 is decreased.

The P-type semiconductor region 110 and a third semiconductor region 312 that will be described below may be regions formed in the same process.

In FIG. 5B, the reset transistor 204 includes a fifth semiconductor region 114 functioning as a source, the gate electrode 311, and the N-type semiconductor region 310 functioning as a drain.

The amplification transistor 205 includes the N-type semiconductor region 310 functioning as a drain, the gate electrode 309, and the eleventh semiconductor region 308 functioning as a source. The eleventh semiconductor region 308 functions as an output node of the amplification transistor 205.

The selection transistor 206 includes the eleventh semiconductor region 308 functioning as a drain, the gate electrode 307, and the ninth semiconductor region 306 functioning as a source. The ninth semiconductor region 306 functions as an output node of the selection transistor 206.

A semiconductor region in the vicinity of the gate insulating film in the lower part of the gate electrode 309 of the amplification transistor 205 corresponds to a channel portion 329. The channel portion 329 is a portion where an inversion layer is formed in accordance with a potential of the gate electrode 309, and a channel is formed. A range where the channel can be formed depends on the potential of the gate electrode, the impurity concentration of the third semiconductor region 312, and a potential difference between the source and the drain. However, the channel portion 329 is located at a portion shallower than the deepest position among the positions of the N-type semiconductor region 310 and the ninth semiconductor region 306 constituting the PN junction with the third semiconductor region 312.

The capacitance 208 has the PN junction capacitor constituted by the N-type first semiconductor region 113 and the P-type second semiconductor region 112. Furthermore, the capacitance 208 includes a gate insulating film capacitance (MOS capacitance) generated in the gate electrode 304 of the switching transistor 207.

The switching transistor 207 includes the fifth semiconductor region 114 functioning as a drain, the gate electrode 304, and the first semiconductor region 113 functioning as a source, and the connection state of the capacitance 208 is switched by the voltage supplied to the gate electrode 304. The first semiconductor region 113 and the fifth semiconductor region 114 are arranged on both sides sandwiching the gate electrode 304. It is sufficient when a part of the first semiconductor region 113 constitutes the PN junction with the second semiconductor region 112.

In addition, a part in the first semiconductor region 113 which does not constitutes the PN junction with the second semiconductor region 112 may constitute the PN junction with the P-type semiconductor region having the lower impurity concentration than that of the second semiconductor region 112. It is noted that the first semiconductor region 113 and the second semiconductor region 112 are arranged in the stated order with respect to the main surface so as to be overlapped with each other in plan view. It is however noted that parts of the first semiconductor region 113 and the second semiconductor region 112 may have the same depth.

The N-type semiconductor region that constitutes the sources and drains of the amplification transistor 205, the reset transistor 204, the selection transistor 206, and the switching transistor 207 constitutes the PN junction with the third semiconductor region 312 having the lower impurity concentration than of the second semiconductor region 112.

First, in a case where the fifth semiconductor region 114 constitutes the PN junction with the third semiconductor region 312, it is possible to decrease the capacitance value of the input node of the amplification transistor 205 as compared with a case where the fifth semiconductor region 114 constitutes the PN junction with the second semiconductor region 112.

Furthermore, in a case where the ninth semiconductor region 306 and the eleventh semiconductor region 308 constitute the PN junction with the third semiconductor region 312, it is possible to decrease the capacitances of those regions as compared with a case where those regions constitute the PN junction with the second semiconductor region 112. Accordingly, the capacitance of the signal line 211 is decreased, and it is possible to increase the speed of driving of the signal line 211.

Herein, it is described that the third semiconductor region 312 is a single region, but the third semiconductor region 312 may be constituted by a plurality of P-type semiconductor regions. In addition, the capacitance 208 and the amplification transistor 205 are arranged in the same active region according to the present exemplary embodiment but may be arranged in separate active regions. It is however noted that, in either case, the P-type added impurity concentration of the PN junction surface of the capacitance 208 is higher than the highest value of the P-type added impurity concentration in the region from the main surface of the semiconductor region up to the depth at which the source region and the drain region of the amplification transistor 205 are arranged in the P-type semiconductor region arranged in the lower part of the gate electrode of the amplification transistor 205.

Figure 6A:
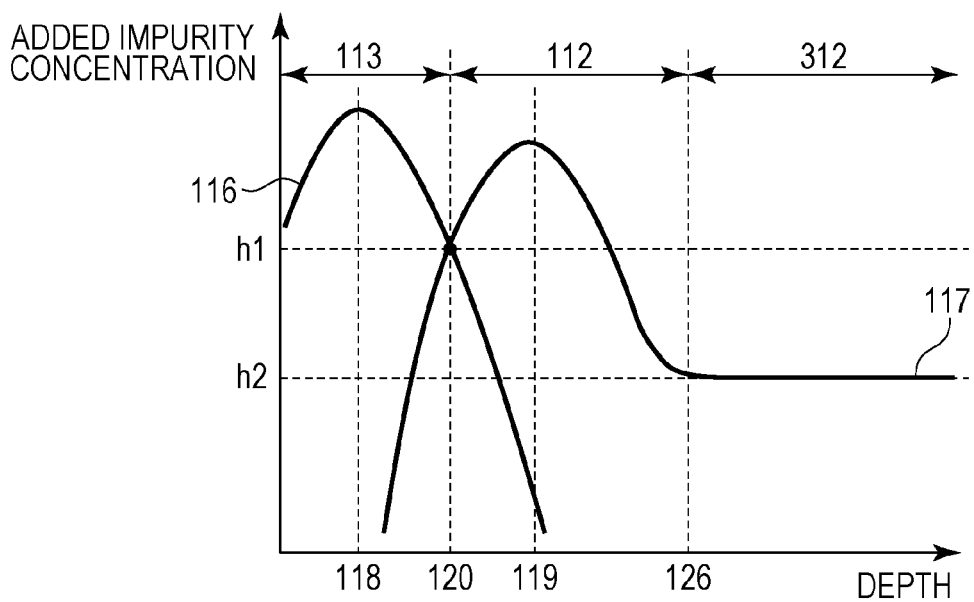
FIGS. 6A and 6B are explanatory diagrams for describing an added impurity concentration according to one or more aspects of the present disclosure.
Figure 6B:
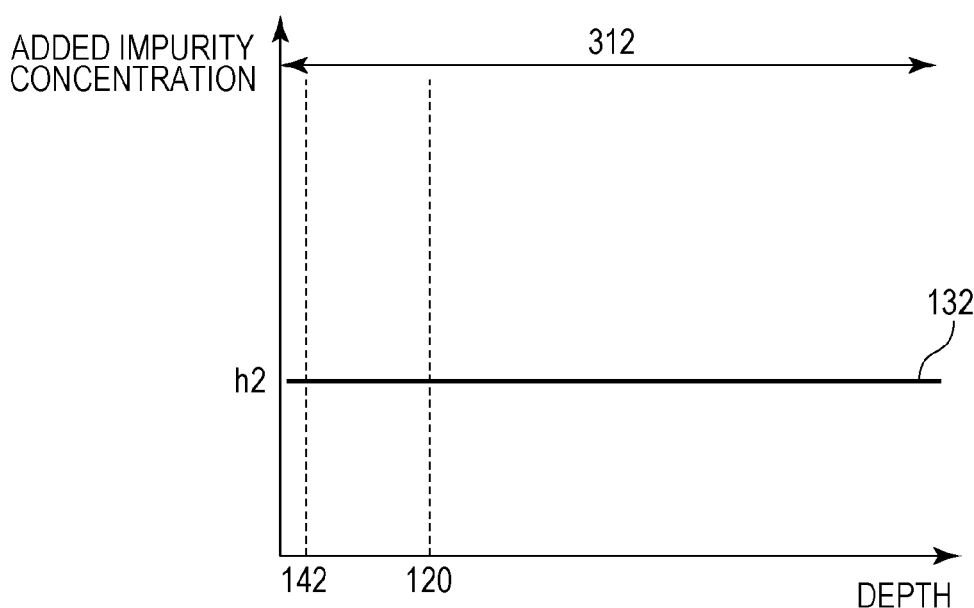

Next, in FIGS. 6A and 6B, an impurity concentration profile in the amplification transistor 205 and the capacitance 208 will be described. FIG. 6A illustrates an impurity concentration profile in a direction (depth direction) along the line E in FIG. 5B, and FIG. 6B illustrates an impurity concentration profile in a direction (depth direction) along the line F in FIG. 5B. A solid line 116 indicates the N-type added impurity concentration. Solid lines 117 and 132 indicate the P-type added impurity concentrations. Herein, the depth direction refers to a direction from the main surface of the semiconductor substrate toward a deep part.

In FIG. 6A, an added impurity concentration distribution of the first semiconductor region 113 has a perk at a position 118, and the added impurity concentration distribution of the second semiconductor region 112 has a perk at a position 119. The P-type added impurity concentration of the second semiconductor region 112 is decreased from the position 119 and becomes equal to an added impurity concentration h2 of the third semiconductor region 312 at a position 126 to be substantially constant. Then, the P-type and N-type added impurity concentrations become equal to each other at a position 120, and the PN junction surface is constituted at this position.

In FIG. 6B, the added impurity concentration distribution of the third semiconductor region 312 does not have a peak and is substantially constant at the added impurity concentration h2. When the amplification transistor 205 is put into the ON state, an inversion layer is formed from the surface of the semiconductor substrate to a position 142, and this part corresponds to the channel portion 329. It is noted that the position 142 is a position shallower than the depth at which the eleventh semiconductor region 308 constituting the source of the amplification transistor 205 and the N-type semiconductor region 310 constituting the drain are arranged.

Herein, the position 120 illustrated in FIG. 6A, that is, the P-type and N-type added impurity concentrations in the PN junction surface of the capacitance 208 are h1. The P-type added impurity concentration in the lower part of the gate electrode 309 of the amplification transistor 205 from the position 142 to the position 120 is h2. Then, a relationship of the added impurity concentration h1>the added impurity concentration h2 is satisfied.

It is noted that, in FIG. 6A and FIG. 6B, the added impurity concentration of the third semiconductor region 312 is substantially uniformly distributed and converged to the added impurity concentration h2, but as will be described below, the third semiconductor region 312 may be a region having a plurality of peaks.

Next, a case will be described in which attention is paid on the impurity concentrations of the P-type and N-type semiconductor regions. From FIGS. 5A and 5B and FIGS. 6A and 6B, the second semiconductor region 112 and the first semiconductor region 113 constitute the PN junction of the capacitance 208. The third semiconductor region 312 is arranged in the lower part of the gate electrode 309 of the amplification transistor 205.

Herein, when attention is paid on the impurity concentrations of the second semiconductor region 112 and the third semiconductor region 312, the impurity concentration of the second semiconductor region 112 constituting the capacitance 208 is higher than the impurity concentration of the third semiconductor region 312 arranged in the lower part of the gate electrode 309 of the amplification transistor 205.

When either the above-described relationship of the added impurity concentrations or the above-described relationship of the impurity concentrations is satisfied, without increasing the capacitance value of the input node of the amplification transistor 205 when the capacitance 208 is in the non-connection state, it is possible to increase the capacitance value of the capacitance 208. Next, a reason thereof will be described.

As a method of increasing the capacitance value of the capacitance 208, it is conceivable to increase the impurity concentration of the semiconductor region constituting the PN junction capacitor. Expression 1 represents a relationship between the impurity concentration of the semiconductor region and the capacitance value in the PN junction capacitor.

$$W_{p+n} = \sqrt{\frac{2\varepsilon_{Si}\varepsilon_0}{q}\left(\frac{N_A + N_D}{N_A N_D}\right)(V_{bi} - V)} \quad (1)$$

Where $\varepsilon_{Si}$ denotes a relative dielectric constant of silicon, $\varepsilon_0$ denotes a dielectric constant of vacuum, q denotes an elementary charge amount, $N_A$ denotes an acceptor concentration, $N_D$ denotes a donor concentration, $V_{bi}$ denotes a built-in potential, and V denotes a voltage applied to the PN junction. In a case where V is constant, the acceptor concentration or the donor concentration is increased, a depletion layer width $W_{p+n}$ is decreased on the basis of Expression 1. Since the PN junction capacitance is in inverse proportion to the depletion layer width $W_{p+n}$, when the depletion layer width $W_{p+n}$ is decreased, the junction capacitance is increased. That is, in a case where the junction capacitance per unit area is intended to be increased, the acceptor concentration or the donor concentration may be increased to decrease the depletion layer width.

Therefore, when the P-type added impurity concentration in the PN junction surface of the PN junction capacitor is increased or the impurity concentration of the P-type semiconductor region constituting the PN junction capacitor is increased, it is possible to increase the capacitance value of the capacitance 208.

Herein, since the N-type transistor is used for the transistor of the pixel, from the viewpoint of use of common members, it is conceivable to use the P-type semiconductor region constituting the PN junction capacitor of the capacitance 208 as an area for providing the channel of the transistor of the pixel.

For example, according to Japanese Patent Laid-Open No. 2008-205639, a configuration in which a capacitance Cs connected to the input node of the amplification transistor 205 and the transistor constituting the pixel are arranged in a P-type well 11 is disclosed.

When the above-described configuration is adopted, the capacitance value of the input node of the amplification transistor 205 is increased even when the capacitance 208 is put into the non-connection state.

When the amplification transistor 205 is put into the ON state, the gate electrode 309 of the amplification transistor 205 is added with a depletion layer capacitance. This depletion layer capacitance is increased when the impurity concentration of the P-type semiconductor region arranged in the lower part of the gate electrode 309 of the amplification transistor 205 is increased.

Herein, a relationship between the impurity concentration of the P-type semiconductor region and the depletion layer capacitance is represented by Expression 2.

$$C = \frac{\varepsilon}{d} = \sqrt{\frac{qN_A\varepsilon}{4\phi_p}} \quad (2)$$

Where $\varepsilon$ denotes a dielectric constant, d denotes the depletion layer width, q denotes an elementary charge amount, $N_A$ denotes an acceptor concentration, and $\phi_p$ denotes a Fermi potential. That is, when the acceptor concentration of the third semiconductor region 312 corresponding to the region where the channel portion 329 of the amplification transistor 205 is formed is increased, that is, when the P-type impurity concentration is increased, the depletion layer capacitance added to the gate electrode 309 of the amplification transistor 205 is increased. When the capacitance value of the depletion layer capacitance is increased, the capacitance value of the input node of the amplification transistor 205 is therefore increased.

In contrast to this, according to the present exemplary embodiment, the P-type added impurity concentration in the PN junction surface of the capacitance 208 is set to be higher than the P-type added impurity concentration of the third semiconductor region 312 arranged in the lower part of the gate electrode 309 of the amplification transistor 205. Alternatively, a configuration is adopted in which the P-type impurity concentration of the second semiconductor region 112 constituting the PN junction of the capacitance 208 is higher than the impurity concentration of the third semiconductor region 312 where the channel portion 329 of the amplification transistor 205 is formed. According to the above-described configuration, it is possible to increase the capacitance value of the capacitance 208 without increasing the capacitance value of the input node of the amplification transistor 205 in the non-connection state of the capacitance 208.

Herein, the present exemplary embodiment can also be applied to a configuration in which the third semiconductor region 312 has a plurality of peaks of the P-type added impurity concentration in the depth direction. Similarly, the present exemplary embodiment can also be applied to a configuration in which the second semiconductor region 112 has a plurality of peaks of the P-type added impurity concentration in the depth direction.

In these cases, it is sufficient when the P-type added impurity concentration in the PN junction surface of the capacitance 208 is higher than the peak corresponding to the highest value of the added impurity concentration the area from the main surface up to the depth at which the source region and the drain region of the amplification transistor 205 are arranged in the third semiconductor region 312. The same applies to FIG. 8 that will be described below.

Next, an example of a procedure when the image pickup apparatus according to the present exemplary embodiment is manufactured will be described by using the VB-VB schematic cross-sectional view of FIG. 5B. A method in a related art can be used in the following part. First, a semiconductor substrate 320 where the insulator isolation portion 300 is arranged is prepared. The semiconductor substrate 320 includes a pixel region where a plurality of pixels are arranged. The first active region 313A where the photoelectric conversion unit 201 is arranged and the second active region 313B at a position different from the first active region 313A in plan view where the capacitance 208 and the amplification transistor 205 are arranged are arranged in the region where the respective pixels of the pixel region are arranged.

The third semiconductor region 312 is formed by injecting p-type ion to the entire pixel region. The third semiconductor region 312 may be formed by the single ion injection, or a plurality of semiconductor regions layered at different depths by different ion injection energy may be formed.

Next, P-type ion injection is performed at a predetermined depth at which the capacitance is formed in the third semiconductor region 312 to form the second semiconductor region 112. Accordingly, the P-type impurity concentration of the second semiconductor region 112 can be set to be higher than that of the third semiconductor region 312. The third semiconductor region 312 is formed in the amplification transistor 205. For this reason, the highest value of the impurity concentration at the position shallower than the source and drain regions in the region underneath the gate electrode of the amplification transistor 205 becomes lower than that of the second semiconductor region 112.

Second Exemplary Embodiment

Figure 7:
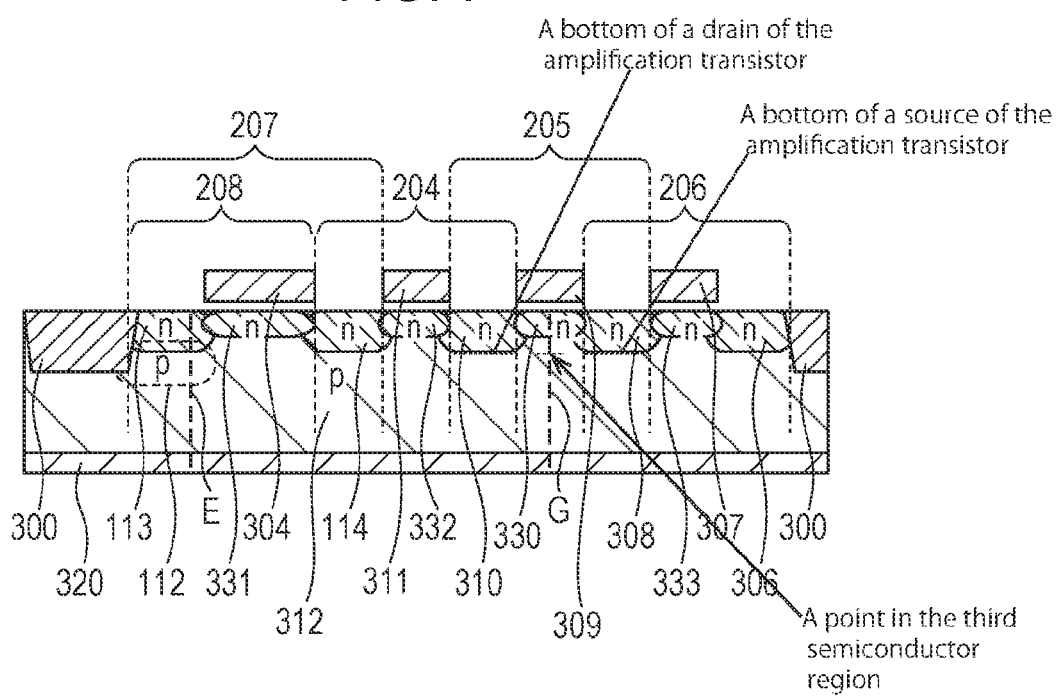
FIG. 7 is a schematic cross-sectional view of the pixel according to an aspect of the present disclosure.

The image pickup apparatus according to the present exemplary embodiment will be described by using FIG. 7 and FIG. 8. FIG. 7 is a schematic cross-sectional view along the line VB-VB in FIG. 4B. Descriptions of the elements having the similar functions to those in FIG. 1 to FIGS. 6A and 6B will be omitted.

FIG. 7 is different from FIG. 5B in that an N-type fourth semiconductor region 330 is arranged in the lower part of the gate electrode 309 of the amplification transistor 205 and an N-type seventh semiconductor region 331 is arranged in the lower part of the gate electrode 304 of the switching transistor 207. FIG. 7 is different from FIG. 5B also in that an N-type eighth semiconductor region 332 is arranged in the lower part of the gate electrode 311 of the reset transistor 204, and an N-type tenth semiconductor region 333 is arranged in the lower part of the gate electrode 307 of the selection transistor 206.

The fourth semiconductor region 330 is arranged at a position overlapped with the gate electrode 309 of the amplification transistor 205 in plan view and constitutes an interface with a gate insulating film of the amplification transistor 205.

The seventh semiconductor region 331 is arranged at a position overlapped with the gate electrode 304 of the switching transistor 207 in plan view and constitutes an interface with a gate insulating film of the switching transistor 207.

The eighth semiconductor region 332 is arranged at a position overlapped with the gate electrode 311 of the reset transistor 204 in plan view and constitutes an interface with a gate insulating film of the reset transistor 204.

The tenth semiconductor region 333 is arranged at a position overlapped with the gate electrode 307 of the selection transistor 206 in plan view and constitutes an interface with a gate insulating film of the selection transistor 206.

In a case where the fourth semiconductor region 330 is not arranged, a surface type MOS capacitance is constituted in which the third semiconductor region 312 arranged so as to constitute the interface with the gate insulating film of the amplification transistor 205 is inverted to become a surface depletion region. For this reason, a potential well is generated in the vicinity of the interface between the semiconductor substrate and the gate insulating film, and the channel portion 329 is formed in a position near the main surface, so that a so-called surface-channel transistor is constituted. At this time, since the channel portion 329 is formed in the position near the main surface, the noise may be increased in some cases.

In contrast to this, when the fourth semiconductor region 330 is arranged, a so-called buried-channel transistor where the channel portion 329 is formed in the deep position from the main surface can be constituted. For this reason, it is possible to suppress the noise as compared with a case where the fourth semiconductor region 330 is not arranged.

When the eighth semiconductor region 332 is arranged in the lower part of the gate electrode 311 of the reset transistor 204, it becomes easier to form the inversion layer as compared with a case where the eighth semiconductor region 332 is not arranged. For this reason, it is possible to decrease a threshold of the reset transistor 204.

When the tenth semiconductor region 333 is arranged in the lower part of the gate electrode 307 of the selection transistor 206, it becomes easier to form the inversion layer as compared with a case where the tenth semiconductor region 333 is not arranged. For this reason, it is possible to decrease a threshold of the selection transistor 206.

The capacitance 208 is mixed in with noise called kTC noise because of a variation of a reset level when a potential of the fifth semiconductor region 114 is reset. To suppress this noise, the capacitance 208 is also preferably reset at the time time in the operation of resetting the potential of the fifth semiconductor region 114.

Herein, in a case where a voltage supplied to the gate electrode 311 of the reset transistor 204 is set as VGres, and a threshold is set as VTHres, a reset level Vresfd of the fifth semiconductor region 114 becomes (VGres−VTHres).

A voltage supplied to the gate electrode 304 of the switching transistor 207 when the capacitance 208 is connected to the input node of the amplification transistor 205 is set as VGapp, and a threshold of the switching transistor 207 is set as VTHapp. At this time, a reset level Vresapp of the capacitance 208 becomes (VGapp−VTHapp).

To reset the capacitance 208 at the reset level of the fifth semiconductor region 114, Vresfd<Vresapp needs to be established. That is, the reset level of the capacitance 208 turns to (VGres−VTHres)<(VGapp−VTHapp). When VGres and VGapp are the same voltage, VTHres>VTHapp is established. In this manner, the threshold of the switching transistor 207 is preferably set to be lower than the threshold of the reset transistor 204 in the operation of resetting the potential of the fifth semiconductor region 114.

When the reset level of the capacitance 208 turns to (VGres−VTHres)>(VGapp−VTHapp), if VGres and VGapp are the same voltage, VTHres<VTHapp is established. At this time, since the capacitance 208 is not reset up to a certain reset level, this configuration is not preferably adopted because the noise arisen from the variation of the reset level is caused.

As described above, the threshold of the reset transistor 204 is preferably set to be different from the threshold of the switching transistor 207, and the seventh semiconductor region 331 is preferably provided to obtain the high image quality signal in which the variation for each pixel is suppressed.

Therefore, the P-type semiconductor region constituting the PN junction with the seventh semiconductor region 331 and the seventh semiconductor region 331 is preferably constituted to have the impurity concentration that satisfies VTHres>VTHapp.

The fourth semiconductor region 330 and the seventh semiconductor region 331 may not necessarily the N-type semiconductor region. While the N-type impurity is added, the region may be the P-type semiconductor region having the lower concentration than that of the third semiconductor region 312.

Next, impurity concentration profiles in the amplification transistor 205 and the capacitance 208 according to the present exemplary embodiment will be described in FIG. 8. FIG. 8 illustrates the impurity concentration profiles in a direction (depth direction) along the line G in FIG. 7. The impurity concentration profile of the capacitance 208 in the direction (depth direction) along the line E is the same as that in FIGS. 6A and 6B.

A solid line 151 indicates the N-type added impurity concentration. A solid line 152 indicates the P-type added impurity concentration.

Figure 8:
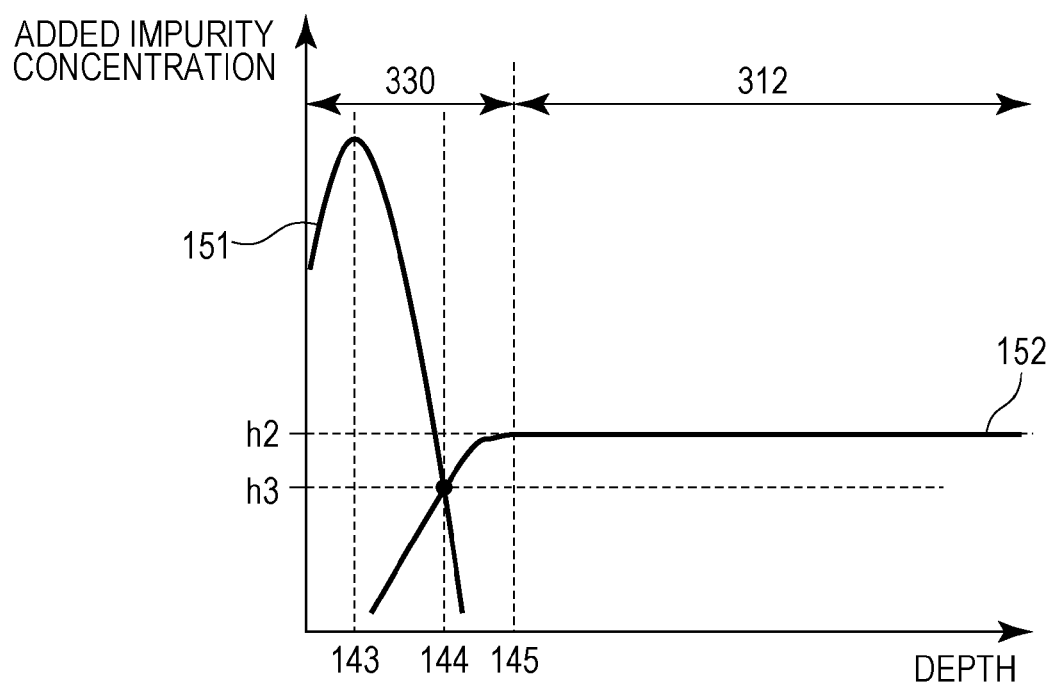
FIG. 8 is an explanatory diagram for describing the added impurity concentration according to an aspect of the present disclosure.

In FIG. 8, the N-type added impurity concentration distribution of the fourth semiconductor region 330 has a peak at a position 143, and the added impurity concentration distribution of the third semiconductor region 312 is constant. The N-type added impurity concentration is decreased from the position 143, and the N-type and P-type added impurity concentrations become equal to each other at a position 144. The PN junction surface is constituted at the position 144.

Herein, as illustrated in FIG. 6A, the P-type and N-type added impurity concentrations in the PN junction surface of the capacitance 208 are h1.

Then, a relationship of the added impurity concentration h1>the added impurity concentration h3 is satisfied.

Next, a case will be described where attention is paid on the impurity concentrations of the P-type and N-type semiconductor regions that constitute the PN junction.

From FIGS. 5A and 5B and FIGS. 6A and 6B, it can be mentioned that the second semiconductor region 112 and the first semiconductor region 113 constitute the PN junction of the capacitance 208. From FIG. 8, the fourth semiconductor region 330 and the third semiconductor region 312 which are arranged the lower part of the gate electrode 309 constitute the PN junction in the lower part of the gate electrode 309 of the amplification transistor 205. The impurity concentration of the second semiconductor region 112 is higher than the impurity concentration of the third semiconductor region 312 constituting the PN junction with the fourth semiconductor region 330.

When any one of these relationships is satisfied, it is possible to decrease the capacitance value of the depletion layer capacitance when the amplification transistor 205 is in the ON state. Accordingly, without increasing the capacitance value of the input node of the amplification transistor 205 when the capacitance 208 is put into the non-connection state, it is possible to increase the capacitance value of the capacitance 208.

Next, an example of a manufacturing procedure of the image pickup apparatus according to the present exemplary embodiment will be described. A difference of this manufacturing procedure from the first exemplary embodiment resides in that N-type ion injection is performed in the third semiconductor region 312 immediately below the gate electrode of the amplification transistor 205, and the P-type impurity concentration is further decreased. The first exemplary embodiment or a method in a related art can be applied to the other manufacturing procedure.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2014-223354, filed Oct. 31, 2014, which is hereby incorporated by reference herein in its entirety.

What is claimed is:

1. An image pickup apparatus comprising:
a plurality of pixels,
wherein at least one of the plurality of pixels includes:
a photoelectric conversion unit;
a reset transistor;
a floating diffusion region;
an amplification transistor configured to amplify a signal based on charges generated by the photoelectric conversion unit; and a capacitance that has a PN junction constituted by a first semiconductor region having a first conductivity type and a second semiconductor region having a second conductivity type and can accumulate the charges;

wherein the one of the plurality of pixels is configured to change a capacitance value of an input node of the amplification transistor by switching a connection state of the capacitance, wherein a switching transistor is configured to switch a connection state of the capacitance with the input node of the amplification transistor, wherein a gate electrode of the amplification transistor is arranged on a main surface of a semiconductor substrate, and a third semiconductor region having the second conductivity type is arranged under the gate electrode of the amplification transistor, and wherein an added impurity concentration of impurity having the second conductivity type on the PN junction surface of the capacitance is higher than an added impurity concentration of impurity having the second conductivity type at a point in the third semiconductor region, the point being at a same depth as a bottom of one of a source and a drain of the amplification transistor.

2. An image pickup apparatus comprising:
a plurality of pixels,
wherein at least one of the plurality of pixels includes:
a photoelectric conversion unit;
a reset transistor;
a floating diffusion region;
an amplification transistor configured to amplify a signal based on charges generated by the photoelectric conversion unit; and
a capacitance that has a PN junction constituted by a first semiconductor region having a first conductivity type and a second semiconductor region having a second conductivity type and can accumulate the charges;

wherein the one of the plurality of pixels is configured to change a capacitance value of an input node of the amplification transistor by switching a connection state of the capacitance, wherein a switching transistor is configured to switch a connection state of the capacitance with the input node of the amplification transistor, wherein a fourth semiconductor region having the first conductivity type is arranged in a position where an interface is constituted with a gate insulating film of the amplification transistor, and the fourth semiconductor region constitutes a PN junction with a third semiconductor region having the second conductivity type, and wherein an added impurity concentration of impurity having the second conductivity type on the PN junction surface of the capacitance is higher than an added impurity concentration of impurity having the second conductivity type on a PN junction surface constituted by the third semiconductor region and the fourth semiconductor region.

3. The image pickup apparatus according to claim 1, wherein a part of the first semiconductor region constitutes a PN junction with the second semiconductor region, and the other part of the first semiconductor region constitutes a PN junction with a semiconductor region having a lower impurity concentration than that of the second semiconductor region.

4. The image pickup apparatus according to claim 1, wherein the capacitance further includes a MOS capacitance.

5. The image pickup apparatus according to claim 1, wherein the capacitance further includes a gate electrode, and the connection state is switched by a voltage supplied to the gate electrode of the capacitance.

6. The image pickup apparatus according to claim 5,
wherein the photoelectric conversion unit is arranged in a different active region from an active region where the capacitance is arranged, and
wherein the input node of the amplification transistor includes:
the gate electrode of the amplification transistor; a fifth semiconductor region having the first conductivity type arranged in the same active region as the active region where the capacitance is arranged; a sixth semiconductor region arranged on the same active region as the active region where the photoelectric conversion unit is arranged; and a conductive material that electrically connects the gate electrode of the amplification transistor, the fifth semiconductor region, and the sixth semiconductor region to one another.

7. The image pickup apparatus according to claim 6, wherein the first semiconductor region and the fifth semiconductor region are arranged both sides of the gate electrode of the capacitance.

8. The image pickup apparatus according to claim 6, wherein the fifth semiconductor region constitutes a PN junction with a semiconductor region having a lower impurity concentration than that of the second semiconductor region.

9. The image pickup apparatus according to claim 6, wherein the sixth semiconductor region constitutes a PN junction with a semiconductor region having a lower impurity concentration than that of the second semiconductor region.

10. The image pickup apparatus according to claim 5, wherein a seventh semiconductor region having the first conductivity type is arranged in the lower part of the gate electrode of the capacitance, and the seventh semiconductor region constitutes an interface with a gate insulating film of the capacitance.

11. The image pickup apparatus according to claim 10, wherein the seventh semiconductor region constitutes a PN junction with the third semiconductor region.

12. The image pickup apparatus according to claim 5,
wherein the pixel includes a reset transistor configured to reset a potential of the input node of the amplification transistor and a switching transistor configured to switch the connection state of the capacitance, and
wherein a threshold of the switching transistor is lower than a threshold of the reset transistor.

13. The image pickup apparatus according to claim 12, wherein an eighth semiconductor region having the first conductivity type is arranged in a position where an interface is constituted with a gate insulating film of the reset transistor.

14. The image pickup apparatus according to claim 13, wherein the eighth semiconductor region constitutes a PN junction with the third semiconductor region.

15. The image pickup apparatus according to claim 1, wherein the pixel includes a selection transistor configured to control an electric conductive state between the amplification transistor and a signal line, and a ninth semiconductor region constituting an output node of the selection transistor constitutes a PN junction with the third semiconductor region.

16. The image pickup apparatus according to claim 15, wherein a tenth semiconductor region having the first conductivity type is arranged in a position where an interface is constituted with a gate insulating film of the selection transistor.

17. The image pickup apparatus according to claim 16, wherein the tenth semiconductor region constitutes a PN junction with the third semiconductor region.

18. The image pickup apparatus according to claim 1, wherein an eleventh semiconductor region constituting an output node of the amplification transistor constitutes a PN junction with the third semiconductor region.

19. The image pickup apparatus according to claim 2, wherein a part of the first semiconductor region constitutes a PN junction with the second semiconductor region, and the other part of the first semiconductor region constitutes a PN junction with a semiconductor region having a lower impurity concentration than that of the second semiconductor region.

20. The image pickup apparatus according to claim 2, wherein the capacitance further includes a MOS capacitance.

21. The image pickup apparatus according to claim 2, wherein the capacitance further includes a gate electrode, and the connection state is switched by a voltage supplied to the gate electrode of the capacitance.

22. The image pickup apparatus according to claim 21,
wherein the photoelectric conversion unit is arranged in a different active region from an active region where the capacitance is arranged, and
wherein the input node of the amplification transistor includes:
the gate electrode of the amplification transistor; a fifth semiconductor region having the first conductivity type arranged in the same active region as the active region where the capacitance is arranged; a sixth semiconductor region arranged on the same active region as the active region where the photoelectric conversion unit is arranged; and a conductive material that electrically connects the gate electrode of the amplification transistor, the fifth semiconductor region, and the sixth semiconductor region to one another.

23. The image pickup apparatus according to claim 22, wherein the first semiconductor region and the fifth semiconductor region are arranged both sides of the gate electrode of the capacitance.

24. The image pickup apparatus according to claim 22, wherein the fifth semiconductor region constitutes a PN junction with a semiconductor region having a lower impurity concentration than that of the second semiconductor region.

25. The image pickup apparatus according to claim 21, wherein a seventh semiconductor region having the first conductivity type is arranged in the lower part of the gate electrode of the capacitance, and the seventh semiconductor region constitutes an interface with a gate insulating film of the capacitance.

26. The image pickup apparatus according to claim 25, wherein the seventh semiconductor region constitutes a PN junction with the third semiconductor region.

27. The image pickup apparatus according to claim 21,
wherein the pixel includes a reset transistor configured to reset a potential of the input node of the amplification transistor and a switching transistor configured to switch the connection state of the capacitance, and
wherein a threshold of the switching transistor is lower than a threshold of the reset transistor.

28. The image pickup apparatus according to claim 27, wherein an eighth semiconductor region having the first conductivity type is arranged in a position where an interface is constituted with a gate insulating film of the reset transistor.

29. The image pickup apparatus according to claim 2, wherein the pixel includes a selection transistor configured to control an electric conductive state between the amplification transistor and a signal line, and a ninth semiconductor region constituting an output node of the selection transistor constitutes a PN junction with the third semiconductor region.

30. The image pickup apparatus according to claim 29, wherein a tenth semiconductor region having the first conductivity type is arranged in a position where an interface is constituted with a gate insulating film of the selection transistor.

* * * * *